US012660222B2

(12) United States Patent
Jiang et al.

(10) Patent No.: US 12,660,222 B2
(45) Date of Patent: Jun. 16, 2026

(54) HIGH ELECTRON MOBILITY TRANSISTOR, PREPARATION METHOD, AND POWER AMPLIFIER/SWITCH

(71) Applicant: HUAWEI TECHNOLOGIES CO., LTD., Shenzhen (CN)

(72) Inventors: Teng Jiang, Dongguan (CN); Xiaoxiang Wu, Dongguan (CN); Sike Tan, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 369 days.

(21) Appl. No.: 18/336,060

(22) Filed: Jun. 16, 2023

(65) Prior Publication Data

US 2023/0352558 A1    Nov. 2, 2023

Related U.S. Application Data

(63) Continuation of application No. PCT/CN2021/131765, filed on Nov. 19, 2021.

(30) Foreign Application Priority Data

Dec. 18, 2020    (CN) .......................... 202011511828.5

(51) Int. Cl.
*H10D 30/01*        (2025.01)
*H03F 3/24*          (2006.01)
(Continued)

(52) U.S. Cl.
CPC ........... *H10D 30/015* (2025.01); *H03F 3/245* (2013.01); *H10D 30/475* (2025.01); *H10D 62/8503* (2025.01)

(58) Field of Classification Search
CPC .............. H10D 30/015; H10D 30/475; H10D 62/8503; H10D 64/0116; H10D 64/62;
(Continued)

(56) References Cited

U.S. PATENT DOCUMENTS 9,153,573 B2 * 10/2015 Yamada ................... H03F 3/21
11,489,068 B2 * 11/2022 Lucolano ............. H10D 30/021
(Continued)

FOREIGN PATENT DOCUMENTS

CN        102130158 A      7/2011
CN        102315262 A      1/2012
(Continued)

OTHER PUBLICATIONS

Office Action for Chinese Application No. 202011511828.5 dated Oct. 18, 2024, 10 pages.
(Continued)

*Primary Examiner* — Tan N Tran

(57)                ABSTRACT
The technology of this application relates to a high electron mobility transistor, including a substrate and a GaN channel layer and an AlGaN barrier layer that are sequentially stacked on the substrate. Two through holes that are spaced apart from each other are opened in the AlGaN barrier layer. Each of the through holes penetrates the AlGaN barrier layer along a thickness direction of the AlGaN barrier layer, and a hole wall of each of the through holes has at least one stepped structure. Each of the through holes has an upper opening away from the substrate and a lower opening close to the substrate. The high electron mobility transistor further includes a source and a drain, where the source and the drain each fill up a through hole and are directly in contact with and connected to the GaN channel layer.

19 Claims, 7 Drawing Sheets

100

(51) Int. Cl.
    *H10D 30/47*      (2025.01)
    *H10D 62/85*      (2025.01)

(58) Field of Classification Search
    CPC ...... H10D 64/01; H10D 64/256; H10D 62/10;
                  H03F 3/245; H03F 2200/451; H03F
                   3/195; H03F 3/21; H01L 21/28575
    See application file for complete search history.

(56) References Cited

U.S. PATENT DOCUMENTS

| | | | | |
|---|---|---|---|---|
| 11,721,763 | B2 * | 8/2023 | Tsai ................... | H01L 23/5283 |
| | | | | 257/382 |
| 12,211,923 | B2 * | 1/2025 | Cheng ................. | H10D 30/015 |
| 2003/0218183 | A1 | 11/2003 | Micovic et al. | |
| 2007/0254419 | A1 * | 11/2007 | Kanda ................ | H10F 39/1865 |
| | | | | 257/E29.253 |
| 2011/0272665 | A1 | 11/2011 | Yamaguchi et al. | |
| 2012/0007098 | A1 * | 1/2012 | Sakurai ................. | H10D 64/62 |
| | | | | 257/E29.089 |
| 2014/0097473 | A1 | 4/2014 | Ikura | |
| 2020/0111876 | A1 | 4/2020 | Wang et al. | |
| 2020/0161447 | A1 | 5/2020 | Chou et al. | |

FOREIGN PATENT DOCUMENTS

| | | | |
|---|---|---|---|
| CN | 103377926 | A | 10/2013 |
| CN | 103972069 | A | 8/2014 |
| CN | 106033724 | A | 10/2016 |
| CN | 106531621 | A | 3/2017 |
| CN | 106783614 | A | 5/2017 |
| CN | 107591439 | A | 1/2018 |
| CN | 109103249 | A | 12/2018 |
| CN | 109671776 | A | 4/2019 |
| JP | 2008-072083 | * | 3/2008 |
| JP | 2008072083 | A | 3/2008 |
| KR | 20020049163 | A | 6/2002 |
| KR | 20090029897 | A | 3/2009 |
| KR | 20100034921 | A | 4/2010 |

OTHER PUBLICATIONS

European Search Report for EP Application No. 21905441.8 dated Apr. 19, 2024, 6 pages.

J. Zhang et al., "Ultralow-Contact-Resistance Au-Free Ohmic Contacts With Low Annealing Temperature on AlGaN/GaN Heterostructures," in IEEE Electron Device Letters, vol. 39, No. 6, pp. 847-850, total: 4 pages.

Haijiang Yu, L. McCarthy, S. Rajan et al "Ion Implanted AlGaN—GaN HEMTs With Nonalloyed Ohmic Contacts," IEEE Electron Device Letters May 26, 2005, 283-285, total: 3 pages.

D. F. Brown et al., "W-band power performance of AlGaN/GaN DHFETs with regrown n+ GaN ohmic contacts by MBE," 2011 International Electron Devices Meeting, Washington, DC, 2011, pp. 19.3.1-19.3.4, total: 4 pages.

International Search Report and Written Opinion issued in PCT/CN2021/131765, dated Feb. 15, 2022, 9 pages.

Shi Changxin:"High-speed GaAs integrated circuits" (with English-language translation), (Jan. 1991), total 13 pages.

Pei Yungqing et al. Design and Application of Switching Voltage Regulator Power Supply-2nd Edition, Machinery Industry Press, Oct. 2020, total 5 pages.

* cited by examiner

200

50

40

30

20

10

91 91 52

50

40

30

20

10

52

91

HIGH ELECTRON MOBILITY TRANSISTOR, PREPARATION METHOD, AND POWER AMPLIFIER/SWITCH

CROSS-REFERENCE TO RELATED APPLICATIONS

This application is a continuation of International Application No. PCT/CN2021/131765, filed on Nov. 19, 2021, which claims priority to Chinese Patent Application No. 202011511828.5, filed on Dec. 18, 2020. The disclosures of the aforementioned applications are hereby incorporated by reference in their entireties.

TECHNICAL FIELD

This application relates to a high electron mobility transistor (HEMT) and a preparation method thereof, and a power amplifier and a power switch that apply the high electron mobility transistor.

BACKGROUND

A semiconductor technology is one of the most important and influential high-tech technologies in the 20th century. The third-generation semiconductor material represented by gallium nitride (GaN) has excellent characteristics such as a large band gap width, high breakdown field strength, and high saturated electron drift speed. A two-dimensional electro gas (2DEG) with high concentration ($10^{13}$ cm$^{-2}$) may be formed in a heterogeneous structure that is formed with AlGaN material, and is an ideal material for a high-temperature, high-voltage, high-frequency, and high-power microwave device. After more than 20 years of rapid development, GaN-based HEMT has become the first choice for high-performance radio frequency systems. It is not only prominent in military equipment, but also in building 4G and 5G mobile communication base stations in the field of civil communications. The GaN-based HEMT is used as a three-terminal device, and both a source and a drain of the GaN-based HEMT are made of metal electrodes by an ohmic contact (metal-semiconductor contact) process, to implement a signal grounding function and a signal output function. The quality of ohmic contact performance not only directly affects key performance indicators such as a saturated output current, an on resistance, and a breakdown voltage of the device, but also affects performance and reliability of the device in high-frequency and high-temperature application scenarios.

SUMMARY

A first aspect of embodiments of this application provides a high electron mobility transistor, including a substrate and a nucleation layer, a buffer layer, a GaN channel layer, and an AlGaN barrier layer that are sequentially stacked on the substrate. Two through holes that are spaced apart from each other are opened in the AlGaN barrier layer, each of the through holes penetrates the AlGaN barrier layer along a thickness direction of the AlGaN barrier layer, a hole wall of each of the through holes has at least one stepped structure, the through holes each have an upper opening away from the substrate and a lower opening close to the substrate, and an opening area of the upper opening is greater than an opening area of the lower opening. The high electron mobility transistor further includes a source and a drain, where the source and the drain each fill up a through hole and are directly in contact with and connected to the GaN channel layer.

For the GaN-based high electron mobility transistor provided with the source and the drain, the hole wall of the through hole having a stepped structure is designed, to form a multi-step contact between an ohmic metal material (a metal material of the source and the drain) and the AlGaN barrier layer, thereby enlarging a contact area between the ohmic metal material and the AlGaN barrier, affecting a barrier shape, increasing a possibility of forming a tunneling current, reducing an ohmic contact resistance, and improving performance of the GaN-based high electron mobility transistor.

In an implementation of this application, each of the through holes includes at least two through hole parts that are sequentially in communication along the thickness direction of the AlGaN barrier layer, and opening areas of the at least two through hole parts decrease one by one along the thickness direction of the AlGaN barrier layer and a direction pointing to the substrate.

The foregoing structure of the through hole ensures that the through hole wall has at least one stepped structure along the thickness direction of the AlGaN barrier layer and the direction pointing to the substrate, and the through hole is reduced step by step.

In an implementation of this application, both the source and the drain protrude relative to a surface of the AlGaN barrier layer away from the substrate, and both the source and the drain extend into the GaN channel layer.

The source and the drain protrude from the surface of the AlGaN barrier layer away from the substrate, to facilitate subsequent electrical connection to a signal line.

In an implementation of this application, the source and the drain respectively include a Ti layer, an Al layer, a metal isolation layer, and an Au layer that are sequentially attached to the hole wall of the through hole, and a material of the metal isolation layer is selected from at least one of Ni, Pt, Cr, Pd, and Mo metals.

During annealing, the Ti layer undergoes solid-phase chemical reaction with the GaN channel layer and the AlGaN barrier layer to form TiN. The Al layer mainly serves as a catalyst to promote the solid-phase chemical reaction between a nitrogen atom and Ti. In addition, the Al layer should be able to form a low-work function and dense alloy with Ti. Ti and Al are easy to form an insulated oxide and hydroxide. Therefore, the Au layer needs to be added. The metal isolation layer is configured to block mutual diffusion between the Au layer and the Al layer.

In an implementation of this application, a thickness of the Ti layer is greater than or equal to 10 nm and less than or equal to 30 nm. A thickness of the Al layer is greater than or equal to 100 nm and less than or equal to 200 nm. A thickness of the metal isolation layer is greater than or equal to 30 nm and less than or equal to 60 nm. A thickness of the Au layer is greater than or equal to 50 nm and less than or equal to 100 nm.

The thickness of each layer of metal material of the source and the drain is properly designed to ensure that both the source and the drain form a good ohmic contact with the GaN channel layer.

In an implementation of this application, the high electron mobility transistor further includes a nucleation layer and a buffer layer that are sequentially stacked on the substrate, where the nucleation layer is located between the substrate and the buffer layer, and the buffer layer is located between the nucleation layer and the GaN channel layer.

In an implementation of this application, a material of the nucleation layer is AlN, and a thickness of the nucleation layer is greater than or equal to 0.1 nm and less than or equal to 500 nm.

Disposing the nucleation layer is to provide a flat nucleation surface for growth of a GaN epitaxial layer (including the buffer layer, the GaN channel layer, and the AlGaN barrier layer) subsequently formed on the nucleation layer, and reduce a contact angle of nucleation growth of the GaN epitaxial layer, so that the GaN epitaxial layer grows to form a flat film layer.

In an implementation of this application, a material of the buffer layer is graded AlGaN or GaN/AlN superlattices; a content of Al in the graded AlGaN gradually increases along a direction close to the substrate; and a thickness of the buffer layer is greater than or equal to 0.1 μm and less than or equal to 10 μm.

The buffer layer is disposed to buffer a stress in the high electron mobility transistor.

In an implementation of this application, a thickness of the GaN channel layer is greater than or equal to 0.1 μm and less than or equal to 10 μm, and a thickness of the AlGaN barrier layer is greater than or equal to 0.1 nm and less than or equal to 50 nm.

The thickness of the GaN channel layer and the AlGaN barrier layer is properly designed to ensure good performance of the high electron mobility transistor.

A second aspect of embodiments of this application provides a preparation method for a high electron mobility transistor, including the following steps. Provide a substrate, and form a GaN channel layer and an AlGaN barrier layer sequentially on the substrate. Dispose, in the AlGaN barrier layer, two through holes that penetrate the AlGaN barrier layer and are spaced apart from each other, where a hole wall of each of the through holes has at least one stepped structure, each of the through holes has an upper opening away from the substrate and a lower opening close to the substrate, and an opening area of the upper opening is greater than an opening area of the lower opening. Fill the through holes with a metal material, to respectively form a source and a drain that are directly in contact with and connected to the GaN channel layer.

Based on the GaN-based HEMT preparation method, the AlGaN barrier layer may be implemented by a plurality of times of cyclic etching, and a through hole having a stepped structure is implemented, to form a multi-step contact between an ohmic contact metal and a barrier region, thereby reducing an ohmic contact resistance and improving performance of the GaN-based HEMT device.

In an implementation of this application, when the hole wall of the through hole has one stepped structure, the forming the through hole includes the following steps. Form a patterned photoresist layer on the AlGaN barrier layer, to enable the photoresist layer to partially cover an upper surface of the AlGaN barrier layer away from the substrate, where a region of the upper surface that is not covered by the photoresist layer is a source/drain windowing region. Etch the AlGaN barrier layer from the source/drain windowing region by using a dry etching method, where an etching depth is less than a thickness of the AlGaN barrier layer. Remove partially a portion of the photoresist layer surrounding the source/drain windowing region, to enlarge the source/drain windowing region. Etch the AlGaN barrier layer further from the enlarged source/drain windowing region by using the dry etching method, to etch through the AlGaN barrier layer.

The AlGaN barrier layer is dry etched twice and the photoresist layer is dry etched once, so that the hole wall of the through hole has one stepped structure and the through hole is reduced step by step.

In an implementation of this application, when the hole wall of the through hole has at least two stepped structures, the forming the through hole includes the following steps. Form a patterned photoresist layer on the AlGaN barrier layer, to enable the photoresist layer to partially cover an upper surface of the AlGaN barrier layer away from the substrate, where a region of the upper surface that is not covered by the photoresist layer is a source/drain windowing region. Etch the AlGaN barrier layer from the source/drain windowing region by using a dry etching method, where an etching depth is less than a thickness of the AlGaN barrier layer; and remove partially a portion of the photoresist layer surrounding the source/drain windowing region, to enlarge the source/drain windowing region. Etch the AlGaN barrier layer further from the enlarged source/drain windowing region, without etching through the AlGaN barrier layer. Repeat the step of removing partially the portion of the photoresist layer surrounding the source/drain windowing region and the step of dry etching the AlGaN barrier layer at least once, until the AlGaN barrier layer is etched through.

The AlGaN barrier layer is dry etched at least twice and the photoresist layer is dry etched at least once, so that the hole wall of the through hole has at least two stepped structures and the through hole is reduced step by step.

In an implementation of this application, a mixed gas of $Cl_2$ and $BCl_3$ is used as an etching gas for the dry etching, and $O_2$ is used as an etching gas for partially removing the photoresist layer.

The etching gas is selected, to ensure an etching effect on the AlGaN barrier layer and the photoresist layer, and implement that the hole wall of the through hole has at least one stepped structure and the through hole is reduced step by step.

In an implementation of this application, the preparation method further includes: after the through hole is formed and before the source and the drain are formed, performing wet or plasma treatment on the hole wall of the through hole, to remove impurities on the hole wall of the through hole and roughen the hole wall of the through hole.

This step facilitates subsequent deposition of metal materials of the source and the drain in the through hole, and improves bonding strength of the metal materials and the hole wall of the through hole.

In an implementation of this application, the step of forming the source and the drain includes: depositing a Ti layer, an Al layer, a metal isolation layer, and an Au layer sequentially on a hole wall of the through hole, where a material of the metal isolation layer is selected from at least one of Ni, Pt, Cr, Pd, and Mo metals; and performing annealing treatment on the Ti layer, the Al layer, the metal isolation layer, and the Au layer that are formed through deposition.

During annealing, the Ti layer undergoes solid-phase chemical reaction with the GaN channel layer and the AlGaN barrier layer to form TiN. The Al layer mainly serves as a catalyst to promote the solid-phase chemical reaction between a nitrogen atom and Ti. In addition, the Al layer should be able to form a low-work function and dense alloy with Ti. Ti and Al are easy to form an insulated oxide and hydroxide. Therefore, the Au layer needs to be added. The metal isolation layer is configured to block mutual diffusion between the Au layer and the Al layer. In an implementation of this application, a thickness of the Ti layer is greater than or equal to 10 nm and less than or equal to 30 nm. A thickness of the Al layer is greater than or equal to 100 nm and less than or equal to 200 nm. A thickness of the metal isolation layer is greater than or equal to 30 nm and less than or equal to 60 nm. A thickness of the Au layer is greater than or equal to 50 nm and less than or equal to 100 nm.

The thickness of each layer of metal material of the source electrode and the drain electrode is properly designed to ensure that both the source electrode and the drain electrode form a good ohmic contact with the GaN channel layer.

In an implementation of this application, an annealing temperature for the annealing treatment is greater than or equal to 500° C. and less than or equal to 800° C.

The source and the drain are made of multiple layers of metal materials that have undergone the annealing treatment, which helps reduce a contact resistance.

In an implementation of this application, the preparation method further includes:

before the GaN channel layer and the AlGaN barrier layer are formed, forming a nucleation layer and a buffer layer that are stacked sequentially on the substrate, where the nucleation layer is located between the substrate and the buffer layer, and the buffer layer is located between the nucleation layer and the GaN channel layer.

Disposing the nucleation layer is to provide a flat nucleation surface for growth of a GaN epitaxial layer (including the buffer layer, the GaN channel layer, and the AlGaN barrier layer) subsequently formed on the nucleation layer, and reduce a contact angle of nucleation growth of the GaN epitaxial layer, so that the GaN epitaxial layer grows to form a flat film layer. Disposing the buffer layer may buffer the stress in the high electron mobility transistor.

A third aspect of embodiments of this application provides a power amplifier to which the foregoing high electron mobility transistor is applied.

The GaN-based high electron mobility transistor has a good ohmic contact, and performance of the GaN-based high electron mobility transistor is improved. The GaN-based high electron mobility transistor may be applied to a power amplifier in a radio frequency front-end module, and may also be applied to a microwave and millimeter-wave power amplifier in communication, instrumentation, military application, and the like.

A fourth aspect of embodiments of this application provides a power switch to which the high electron mobility transistor is applied.

By using the GaN-based high electron mobility transistor in this application, an on resistance of the switch device is further reduced, and switching conversion efficiency of the device is improved.

DESCRIPTION OF MAIN COMPONENT SYMBOLS

Figure 1:
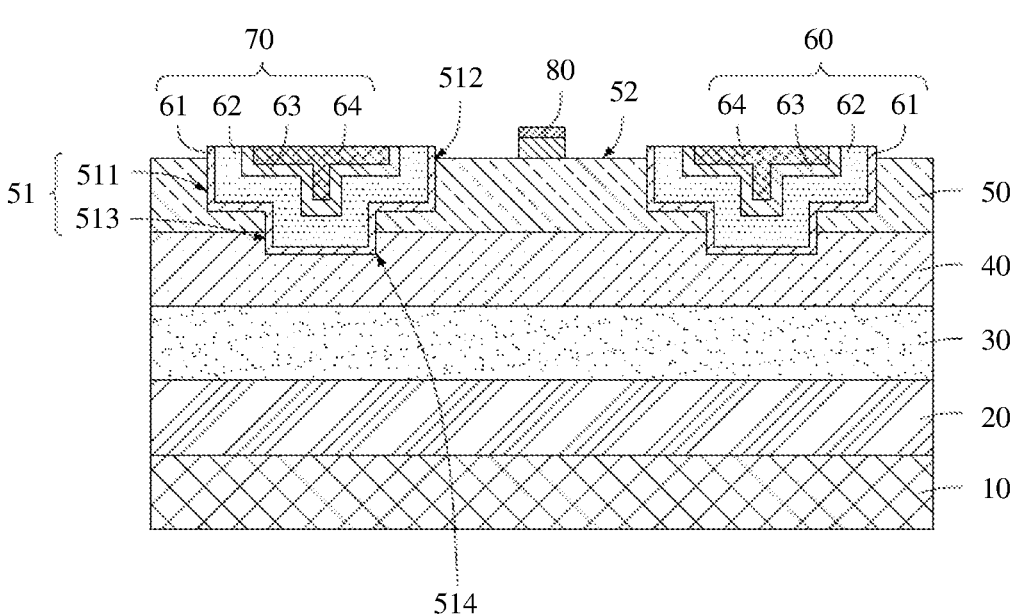
FIG. 1 is an example schematic cross-sectional structural diagram of an HEMT according to Embodiment 1 of this disclosure.

HEMT: 100, 200; substrate: 10; nucleation layer: 20; buffer layer: 30; GaN channel layer: 40; AlGaN barrier layer: 50; through hole: 51; first hole part: 511; second hole part: 513; upper opening: 512; lower opening: 514; upper surface: 52; source: 60; drain: 70; Ti layer: 61; Al layer: 62; metal isolation layer: 63; Au layer: 64; gate: 80; photoresist layer: 90; source/drain windowing region: 91; compensator: 310; input matching network: 330; resistor: 350; power supply: 410; diode: 420; inductor: 430.

DESCRIPTION OF EMBODIMENTS

The following describes embodiments of this application with reference to the accompanying drawings in embodiments of this application.

In a large-scale antenna technology, a key technology of 5G, a base station transceiver uses a large quantity of array antennas. Such an array antenna structure includes a corresponding transmit receive unit. High output power, linearity, and power consumption requirements also drive a power amplifier deployed on the base station to be converted from an LDMOS to a GaN-based HEMT. With a small size and high power density of the GaN-based HEMT, a highly integrated product solution can be implemented, such as a modular RF front-end device.

In an AlGaN/GaN heterojunction HEMT structure, a band gap width of AlGaN is large, and no suitable single metal material can directly form an ohmic contact with the AlGaN/GaN hetero junction HEMT structure with a relatively small contact resistance. Currently, a method commonly used in the industry is to use a metal Ti evaporated by magnetron sputtering or electron beams, and then form an alloy effect with the AlGaN after annealing. In this way, a contact resistance is reduced by increasing an electron tunneling probability. However, with continuous improvement of performance requirements of a device, especially emergence of application requirements of the device in a low-voltage scenario, optimization and improvement of an ohmic contact process of an AlGaN/GaN heterojunction HEMT also pose a greater challenge. Reducing an ohmic contact resistance to further reduce a series resistance, reduce a parasitic effect, and improve an amplification capability and efficiency of the device is an important research direction of a radio frequency and power AlGaN/GaN heterojunction HEMT device.

This application provides a GaN-based HEMT, which can effectively reduce an ohmic contact resistance and improve performance of a GaN-based HEMT device. The GaN-based HEMT in this application may be applied to microwave and millimeter-wave power amplifiers used for communication, instrumentation, military applications, and the like, including but not limited to a monolithic microwave integrated circuit (MMIC), a radio frequency front-end module, and the like.

The GaN-based HEMT in this application may be applied to a low-voltage GaN-based HEMT power amplifier device field in the radio frequency field, and may be further applied to a low-voltage GaN-based HEMT power switch device in the fast charging field of terminal products such as mobile phones or tablets. Because an operating voltage in this field is relatively low, and a requirement on a breakdown voltage of a device is not high, the GaN-based HEMT in this application is used to further reduce an on resistance of the switch device, and improve switching conversion efficiency of the device.

As shown in FIG. 1, the HEMT 100 includes a substrate 10 and a GaN channel layer 40 and an AlGaN barrier layer 50 that are sequentially stacked on the substrate 10. Two through holes 51 that are spaced from each other are opened in the AlGaN barrier layer 50. Each of the through holes 51 penetrates the AlGaN barrier layer 50 along a thickness direction of the AlGaN barrier layer 50, and a hole wall of each of the through holes 51 has one stepped structure. Each of the through holes 51 has an upper opening 512 away from the substrate 10 and a lower opening 514 close to the substrate 10, and the upper opening 512 is greater than the lower opening 514. The HEMT 100 further includes a source 60 and a drain 70 that are disposed on an upper surface 52 of the AlGaN barrier layer 50 away from the substrate 10. The source 60 and the drain 70 are spaced from each other, each fill up a through hole 51, and is directly in contact with and connected to the GaN channel layer 40. Both the source 60 and the drain 70 protrude relative to the upper surface 52 of the AlGaN barrier layer 50.

As shown in FIG. 1, the through hole 51 has one stepped structure, and the through hole 51 includes a first hole part 511 and a second hole part 513 that are interconnected along the thickness direction of the AlGaN barrier layer 50. The second hole part 513 is closer to the GaN channel layer 40 than the first hole part 511, and an opening area of the first hole part 511 is greater than an opening area of the second hole part 513. After penetrating through the AlGaN barrier layer 50, the through hole 51 further extends into the GaN channel layer 40, that is, the source 60 and the drain 70 are further extended and inserted into the GaN channel layer 40.

Figure 2:
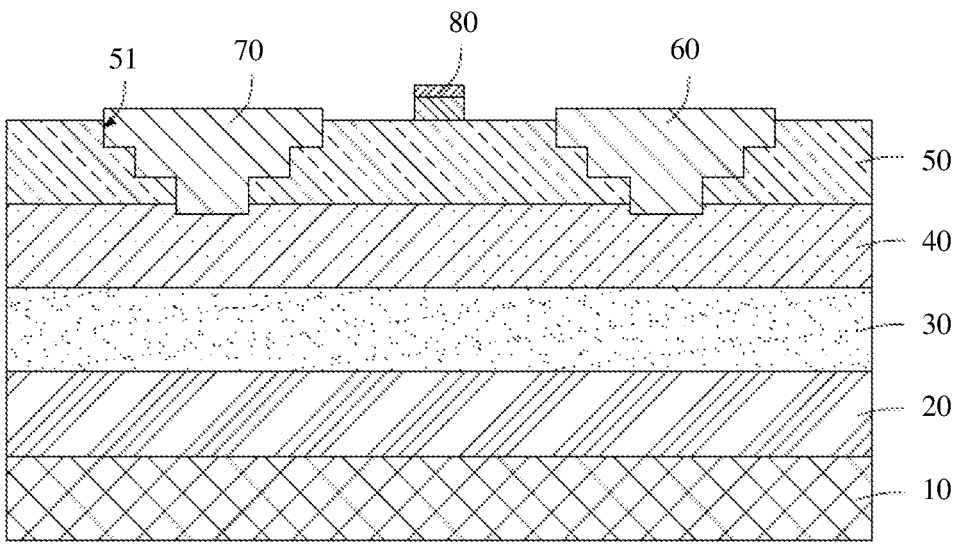
FIG. 2 is an example schematic cross-sectional structural diagram of an HEMT according to Embodiment 2 of this disclosure.

As shown in FIG. 1, the HEMT 100 further includes a nucleation layer 20 and a buffer layer 30 that are sequentially stacked on the substrate 10, where the nucleation layer 20 is located between the substrate 10 and the buffer layer 30, and the buffer layer 30 is located between the nucleation layer 20 and the GaN channel layer 40. The HEMT 200 shown in FIG. 2 is basically the same as the HEMT 100 shown in FIG. 1, and a difference lies in that a through hole 51 of the HEMT 200 has two stepped structures. That is, the through holes 51 each include three hole parts (not shown in the figure) that are sequentially connected and disposed along the thickness direction of the AlGaN barrier layer 50, and openings of the three hole parts decrease one by one along the thickness direction of the AlGaN barrier layer 50 and a direction pointing to the substrate 10.

It may be understood that a hole wall of each of the through holes 51 of the HEMT in this application is not limited to having one or two steps, provided that there is one or more steps.

It may be understood that, in this application, the through holes 51 each include at least two hole parts (not shown in the figure) that are sequentially connected and disposed along the thickness direction of the AlGaN barrier layer 50, and openings of the at least two hole parts decrease one by one along the thickness direction of the AlGaN barrier layer 50 and in a direction pointing to the substrate 10. The source 60 and the drain 70 are refined step by step.

The AlGaN barrier layer 50 is configured to cooperate with the GaN channel layer 40 and generate a two-dimensional electron gas (2DEG) in a region where the GaN channel layer 40 is connected to the AlGaN barrier layer 50 through polarization, to conduct a current. In a three-dimensional solid, if the movement of an electron is blocked (limited) in one direction (for example, the z direction), the electron can only freely move in the other two directions (x and y directions). Such free electrons with two degrees of freedom are referred to as 2DEG. The source 60 and the drain 70 are configured to enable the 2DEG to flow in a channel layer between the source 60 and the drain 70 under effect of an electric field, and conduction between the source 60 and the drain 70 occurs at a two-dimensional electron gas in the channel layer.

In this application, metal materials (ohmic contact metal) of the source 60 and the drain 70 are in contact with both the AlGaN barrier layer 50 and the GaN channel layer 40, and the ohmic contact metal is in stepped contact with the barrier layer. This stepped contact structure enables the 2DEG to form surface contact with the AlGaN barrier layer 50 and form line contact with the GaN channel layer 40. This dual contact mode further increases the probability of 2DEG tunneling to a metal layer, thereby reducing an interface resistance. It should be explained that, because electrons exist in the GaN channel layer in a form of 2DEG, a thickness of electron transmission in the GaN channel layer may be ignored. Therefore, in a region in which the ohmic contact metal is directly in contact with the GaN channel layer 40, electrons in the GaN channel layer directly enter the metal of the source 60 and the drain 70 from this region, which is defined as line contact. It should be further explained that, in a region in which the ohmic contact metal is in contact with the AlGaN barrier layer 50, the 2DEG passes through the AlGaN barrier layer 50 from the GaN channel layer 40 and enters the metal of the source 60 and the drain 70 under an action of an electric field. Because the entire region is covered by metal, electrons can be transmitted in the entire region, which is defined as surface contact.

In this application, a step-shaped through hole 51 is designed for the source 60 and the drain 70, so that a local region of the AlGaN barrier layer 50 is partially etched and does not penetrate the thickness direction of the AlGaN barrier layer 50. However, another local region is fully etched and penetrates the thickness direction of the AlGaN barrier layer 50. A high-concentration two-dimensional electron gas in the channel is maintained by the AlGaN barrier layer 50 in the partially etched region, and the metal material in the fully etched region is in line contact with the 2DEG, thereby reducing the ohmic contact resistance. A step side of the partially etched region of the AlGaN barrier layer 50 increases a contact area between the ohmic metal material and the AlGaN barrier, and affects a shape of the barrier, thereby increasing a possibility of forming a tunneling current. Therefore, the ohmic contact resistance can be reduced. A distance between the metal in the partially etched region and the 2DEG is reduced, thereby reducing the ohmic contact resistance.

Refer to FIG. 1. The source 60 and the drain 70 respectively include a Ti layer 61, an Al layer 62, a metal isolation layer 63, and an Au layer 64. In a process of preparing the source 60 and the drain 70, Ti, Al, a metal isolation material, and Au are sequentially deposited on a hole wall of the through hole 51 by using a physical vapor deposition method. Therefore, the Ti layer 61, the Al layer 62, the metal isolation layer 63, and the Au layer 64 are sequentially attached to the hole wall of the through hole 51. A thickness of the Ti layer 61 is greater than or equal to 10 nm and less than or equal to 30 nm. A thickness of the Al layer 62 is greater than or equal to 100 nm and less than or equal to 200 nm. A thickness of the metal isolation layer 63 is greater than or equal to 30 nm and less than or equal to 60 nm. A thickness of the Au layer 64 is greater than or equal to 50 nm and less than or equal to 100 nm. FIG. 1 and FIG. 2 respectively show two different structures of the source 60 and the drain 70 caused by different number of steps of the through holes 51.

A main objective of disposing the Ti layer 61 is to perform a solid-phase chemical reaction with the GaN channel layer 40 and the AlGaN barrier layer 50 in an annealing process, to form TiN. In addition, a high-density nitrogen vacancy is left in the GaN channel layer 40, to act as a shallow donor and facilitate formation of ohmic contact. The Al layer 62 is mainly used as a catalyst to promote the solid-phase chemical reaction between a nitrogen atom and Ti. In addition, Al in the Al layer 62 and Ti can form a low-work function and dense alloy. It should be noted that, a work function (also referred to as a work function or escape work, and work function in English) refers to a minimum energy (usually in a unit of an electron volt) that needs to be provided to enable a particle of electron to immediately escape from a solid surface. The term "immediate" here means that the final electron position is far from the surface at the atomic scale but still close to the solid at the macroscopic scale. However, both Ti and Al are easy to form an insulated oxide and a hydroxide, and therefore a cap layer needs to be added, and generally Au with stable chemical properties is used. However, Au and Al are easy to diffuse to each other, and reach a material surface of the GaN channel layer 40, which is not conducive to forming good ohmic contact. The metal isolation layer 63 needs to be added to prevent mutual diffusion of the Au layer 64 and the Al layer 62. A material of the metal isolation layer 63 is selected from at least one of Ni, Pt, Cr, Pd, and Mo metals. In this embodiment, the material of the metal isolation layer 63 is Ni. Ti/Al/Ni/Au is a metal system commonly used for ohmic contact of GaN-based materials.

The substrate 10 may be a high-resistance silicon (Si) substrate or a silicon carbide (SiC) substrate.

A material of the nucleation layer 20 may be one or more of aluminum nitride (AlN), gallium nitride (GaN), or gallium aluminum nitride (AlGaN). In other words, the material of the nucleation layer 20 may be aluminum nitride, gallium nitride, or aluminum gallium nitride; the material of the nucleation layer 20 may be made of any two of aluminum nitride, gallium nitride, and aluminum gallium nitride; or the material of the nucleation layer 20 may be made of these three materials: aluminum nitride, gallium nitride, and aluminum gallium nitride. In this embodiment, the material of the nucleation layer 20 is AlN, and a thickness is 0.1 nm to 500 nm. A function of the nucleation layer 20 is: providing a flat nucleation surface for growth of a GaN epitaxial layer (including the buffer layer 30, the GaN channel layer 40, and the AlGaN barrier layer 50) subsequently formed on the nucleation layer 20, and reducing a contact angle of nucleation growth of the GaN epitaxial layer, so that the buffer layer 30, the GaN channel layer 40, and the AlGaN barrier layer 50 grow to form a flat film layer.

In this embodiment, a material of the buffer layer 30 is graded AlGaN or GaN/AlN superlattices (superlattice materials are multi-layer films with two different components alternately growing in thin layers of several nanometers to dozens of nanometers and maintaining strict periodicity). A thickness of the buffer layer 30 is 0.1 μm to 10 μm. The graded AlGaN means that a content of Al in the buffer layer 30 gradually increases along a direction of gradually approaching the substrate 10. The buffer layer 30 is configured to buffer a stress of the HEMT 100.

In this embodiment, a thickness of the GaN channel layer 40 is 0.1 μm to 10 μm, and a thickness of the AlGaN barrier layer 50 is 0.1 nm to 50 nm.

The HEMT 100 further includes a gate 80, and an orthographic projection of the gate 80 on the substrate 10 is located between the source 60 and the drain 70, and is configured to allow or block passing of 2DEG. The gate 80 is made of a conductive metal material. For example, the gate 80 includes a Ni layer (not shown in the figure) and an Au layer (not shown in the figure) that are disposed on the upper surface 52 in a laminated manner. In this embodiment, the gate 80 is located on the upper surface 52 of the AlGaN barrier layer 50 away from the substrate 10. It may be understood that a position of the gate 80 is not limited to being disposed on the upper surface 52 of the AlGaN barrier layer 50, and may be further disposed at another position based on a requirement.

It may be understood that the HEMT 100 and the HEMT 200 may further include some other layers (not shown in the figure). The thickness range values of each layer listed in this application include an end value.

Figure 3:
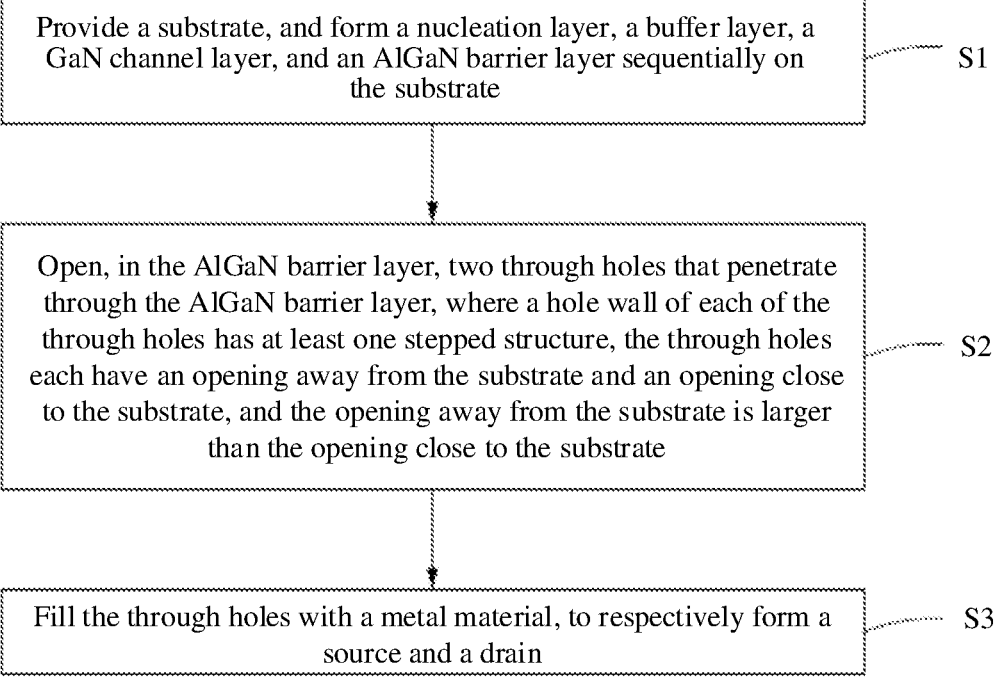
FIG. 3 is an example flowchart of an HEMT preparation method according to this disclosure.

As shown in FIG. 3, in this embodiment, a method for preparing the HEMTs 100, 200 includes the following steps (it is understood that the following steps may be combined with FIG. 4 to FIG. 11).

S1. Provide a substrate, and form a nucleation layer 20, a buffer layer 30, a GaN channel layer 40, and an AlGaN barrier layer 50 sequentially on the substrate.

S2. Open, in the AlGaN barrier layer 50, two through holes 51 that penetrate through the AlGaN barrier layer 50 and are spaced apart from each other, where a hole wall of each of the through holes has at least one stepped structure, the through holes each have an upper opening 512 away from the substrate and a lower opening 514 close to the substrate, and an opening area of the upper opening is greater than an opening area of the lower opening.

S3. Fill the through holes 51 with a metal material, to respectively form a source 60 and a drain 70.

Figure 4:
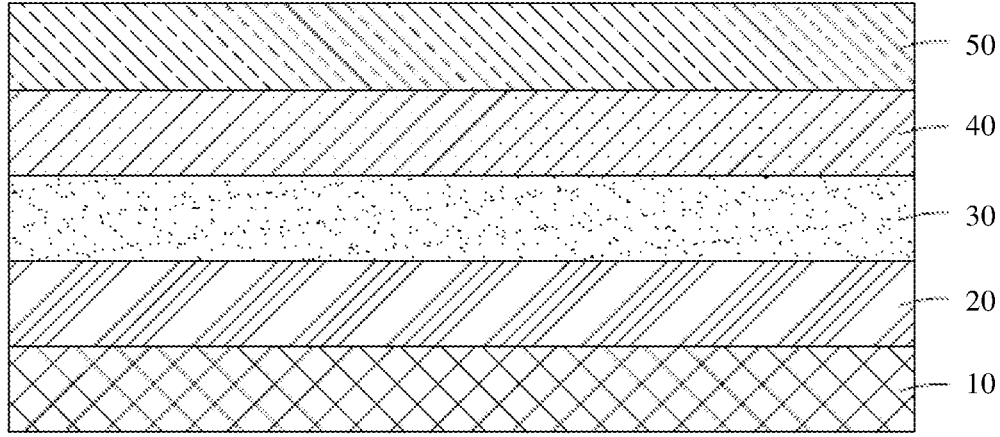
FIG. 4 is an example schematic diagram 1 of an HEMT preparation process according to this disclosure.

For a product obtained after step S1 is completed, refer to FIG. 4. The nucleation layer 20, the buffer layer 30, the GaN channel layer 40, and the AlGaN barrier layer 50 may be sequentially formed on the substrate 10 by using a metal organic chemical vapor deposition (MOCVD) or molecular beam epitaxy (MBE) method. In this embodiment, a thickness of the nucleation layer 20 is 0.1 nm to 500 nm, a thickness of the buffer layer 30 is 0.1 μm to 10 μm, a thickness of the GaN channel layer 40 is 0.1 μm to 10 μm, and a thickness of the AlGaN barrier layer 50 is 0.1 nm to 50 nm.

For step S2, refer to FIG. 5 to FIG. 10. The through holes 51 are opened by etching the AlGaN barrier layer 50 at least twice in phases.

Figure 5:
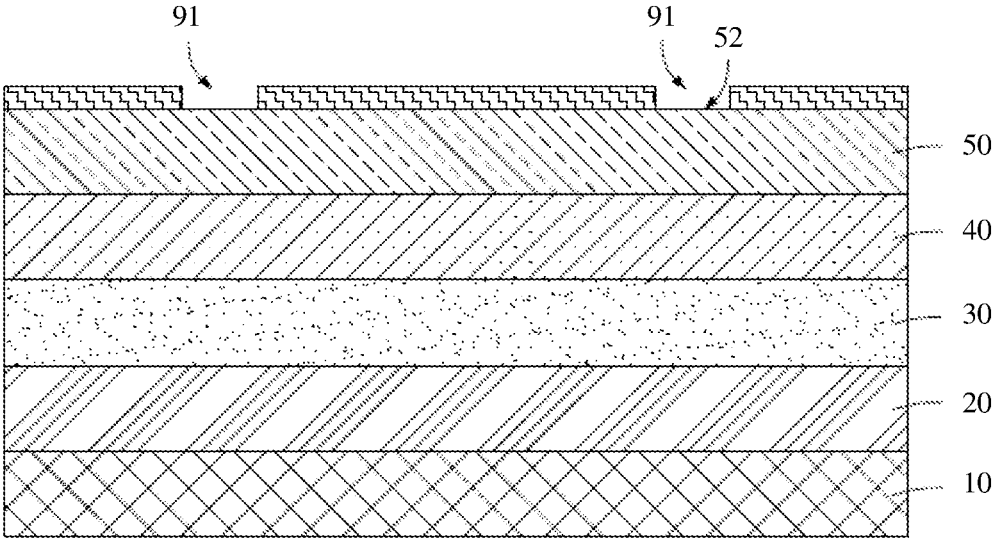
FIG. 5 is an example schematic diagram 2 of an HEMT preparation process according to this disclosure.
Figure 6:
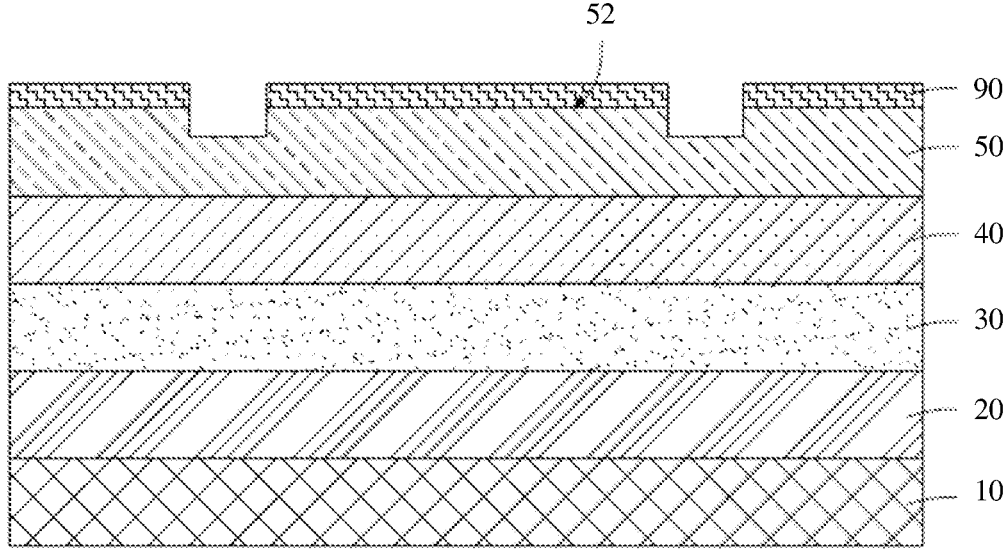
FIG. 6 is an example schematic diagram 3 of an HEMT preparation process according to this disclosure.
Figure 7:
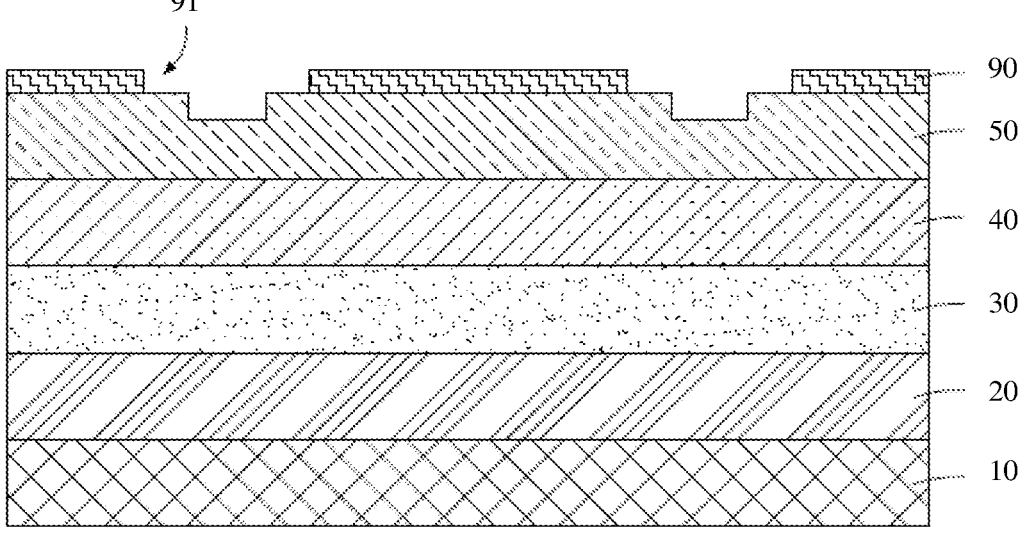
FIG. 7 is an example schematic diagram 4 of an HEMT preparation process according to this disclosure.
Figure 8:
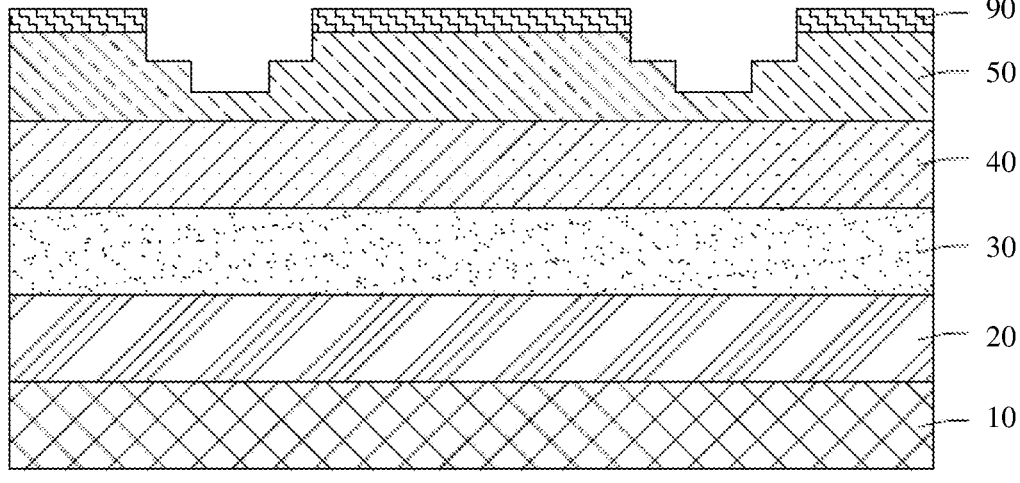
FIG. 8 is an example schematic diagram 5 of an HEMT preparation process according to this disclosure.
Figure 9:
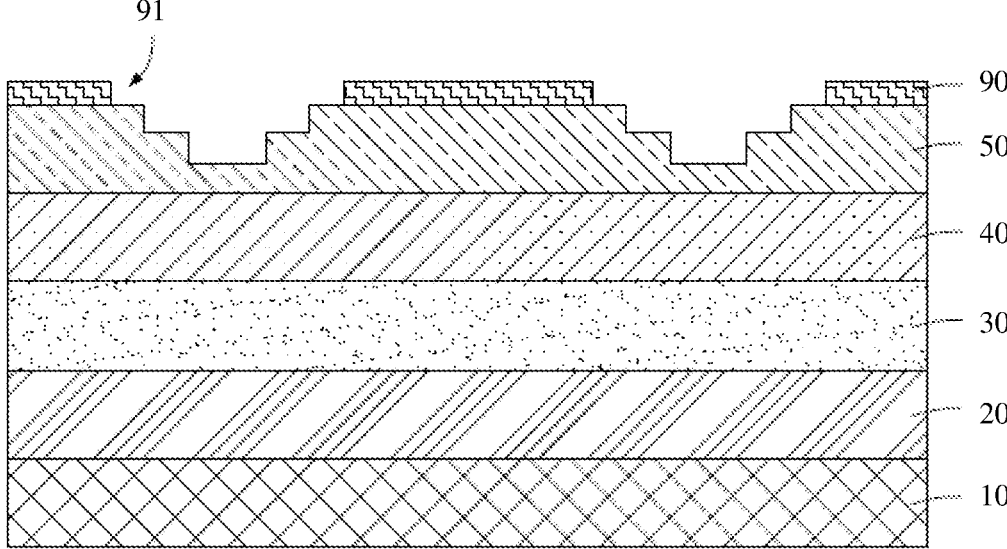
FIG. 9 is an example schematic diagram 6 of an HEMT preparation process according to this disclosure.
Figure 10:
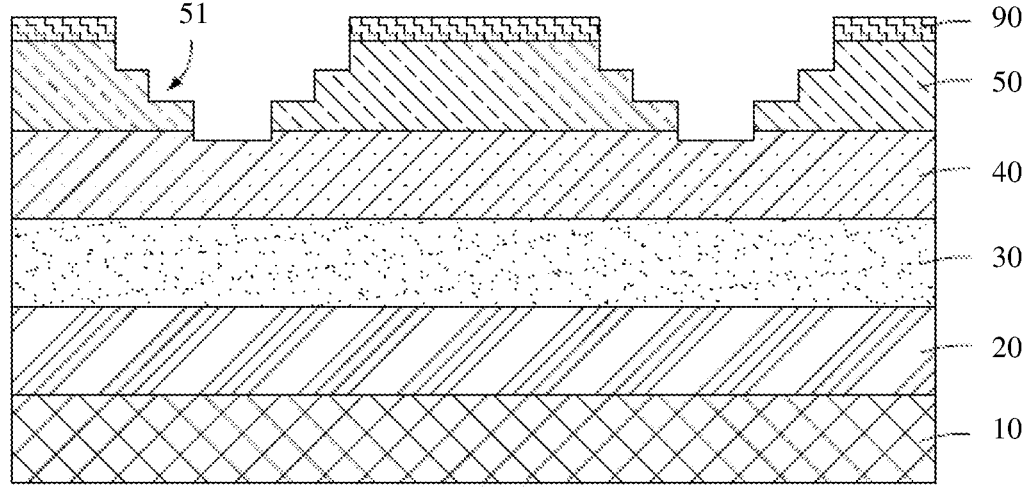
FIG. 10 is an example schematic diagram 7 of an HEMT preparation process according to this disclosure.

When the hole wall of each of the through holes 51 has at least two stepped structures, the step of forming the through holes 51 includes:

as shown in FIG. 5, forming a patterned photoresist layer 90 on the AlGaN barrier layer 50, to enable the photoresist layer 90 to partially cover an upper surface 52 of the AlGaN barrier layer 50 away from the substrate 10, where a region of the upper surface 52 that is not covered by the photoresist layer 90 is a source/drain windowing region 91;

as shown in FIG. 6, etching the AlGaN barrier layer 50 from the source/drain windowing region 91 by using a dry etching method, where an etching depth is less than a thickness of the AlGaN barrier layer 50;

as shown in FIG. 7, removing partially a portion of the photoresist layer 90 surrounding the source/drain windowing region 91, to enlarge the source/drain windowing region 91;

as shown in FIG. 8, etching the AlGaN barrier layer 50 further from the enlarged source/drain windowing region 91 by using the dry etching method, without etching through the AlGaN barrier layer 50; depths of downward etching of the region of the AlGaN barrier layer 50 (corresponding to the source/drain windowing region 91) each time are approximately equal, and in this way, a region of the AlGaN barrier layer 50 is dry etched twice, and another region is dry etched once; and the etching depths of the two regions are different, so that an etching surface is in a stepped shape;

as shown in FIG. 9 and FIG. 10, repeating the step of removing partially the portion of the photoresist layer 90 surrounding the source/drain windowing region 91 and the step of dry etching the AlGaN barrier layer 50 once, respectively, until the AlGaN barrier layer 50 is etched through to obtain a through hole 51, and in this way, a hole wall of the through hole 51 is in a stepped shape; and removing the remaining photoresist layer 90.

It may be understood that a number of steps of the stepped structure of the through hole 51 may be implemented by adjusting a number of times of the step of removing partially the portion of the photoresist layer 90 surrounding the source/drain windowing region 91 and the step of dry etching the AlGaN barrier layer 50.

When the hole wall of the through hole 51 has one stepped structure, the step of forming the through hole 51 is basically similar to the foregoing step, but only two dry etchings are required to etch the AlGaN barrier layer 50, to etch through the AlGaN barrier layer 50, which specifically includes:

forming a patterned photoresist layer 90 on the AlGaN barrier layer 50, to enable the photoresist layer 90 to partially cover an upper surface 52 of the AlGaN barrier layer 50 away from the substrate 10, where a region of the upper surface 52 that is not covered by the photoresist layer 90 is a source/drain windowing region 91;

etching the AlGaN barrier layer 50 from the source/drain windowing region 91 by using a dry etching method, where an etching depth is less than a thickness of the AlGaN barrier layer 50;

removing partially a portion of the photoresist layer 90 surrounding the source/drain windowing region 91, to enlarge the source/drain windowing region 91;

etching the AlGaN barrier layer 50 further from the enlarged source/drain windowing region 91 by using the dry etching method, to etch through the AlGaN barrier layer 50, to obtain the through hole 51; where depths of downward etching of the region of the AlGaN barrier layer 50 (corresponding to the source/drain windowing region 91) each time are approximately equal, and in this way, a region of the AlGaN barrier layer 50 is dry etched twice, another region is dry etched once, and the etching depths of the two regions are different, so that the hole wall of the through hole 51 is in a stepped shape; and removing the remaining photoresist layer 90.

An etching depth of the first dry etching of the AlGaN barrier layer 50 may be half of a thickness of the AlGaN barrier layer 50, but is not limited thereto. In the etching process, the GaN channel layer 40 is also partially etched, but does not penetrate the GaN channel layer 40.

The dry etching uses a mixture of $Cl_2$ and $BCl_3$ as an etching gas; and the photoresist layer 90 is partially removed and etched by $O_2$.

It may be understood that a step surface of the step structure is not limited to being perpendicular to a side wall surface, and a certain tilt angle may be set. In addition, depths and widths at various steps of the through hole 51 may be adjusted by adjusting an etching parameter.

In an embodiment, a specific process parameter of etching the through hole 51 is: in an induction coupling plasma (ICP) etching machine, the AlGaN barrier layer 50 is etched by introducing a $Cl_2/BCl_3$ mixture gas first, an etching depth is half of a thickness of the AlGaN barrier layer 50, ICP power is 30 W, radio frequency power is 100 W, and an etching time is 2 min. Then, a vacuum pumping process is performed to extract remaining gas in the cavity for 1 minute. $O_2$ is then introduced to perform etching on the photoresist layer 90. The ICP power is set to 50 W, and lower electrode power is set to 0 W for 3 minutes. Then, the vacuum pumping process is performed for 1 minute, and remaining $O_2$ is extracted. Finally, the $Cl_2/BCl_3$ mixed gas is introduced again, and the AlGaN barrier layer 50 is etched through to be in contact with the GaN layer.

The remaining photoresist layer 90 may be removed by a photoresist solvent, such as N-methyl pyrrolidone (NMP). Specifically, a product may be placed in the NMP for ultrasonic cleaning for 10 minutes, then ultrasonic cleaning with alcohol for 5 minutes, and rinsing with deionized water for 1 minute.

Before the photoresist layer 90 is formed on the AlGaN barrier layer 50, the upper surface 52 of the AlGaN barrier layer 50 may be further cleaned, to remove impurities and stains on the upper surface 52. The cleaning method may be specifically: First immerse in an HF solution with a concentration of 4 wt % for a specific time (for example, 10 seconds), and remove a surface oxidation layer. Then, use acetone, alcohol, and deionized water in sequence to remove the surface contamination by ultrasonic cleaning, where the cleaning time of acetone, alcohol, and deionized water may be 10 minutes, 5 minutes, and 2 minutes respectively. Finally, dry the surface to remove moisture. For example, bake the surface on a 100° C. hot plate for 5 minutes.

The step of forming a photoresist layer 90 that partially covers the AlGaN barrier layer 50 may include: first forming, on an upper surface 52 of the AlGaN barrier layer 50, the photoresist layer 90 that completely covers the upper surface 52, and then performing exposure and development on the photoresist layer 90 to partially remove the photoresist layer 90 (a patterning process), where a region from which the photoresist layer 90 is removed forms a source/drain windowing region 91. The source/drain windowing region 91 includes a source windowing region and a drain windowing region that are spaced from each other. The photoresist layer 90 may be formed by using a coating method, which may specifically include: coating the upper surface 52 by a photoresist (AZ series 214), setting a homogenizing parameter, for example, an initial acceleration of 500 r/min, an acceleration time of 9*s*, a homogenizing rotation speed of 4000 r/min, and time of 30*s*, to obtain a photoresist layer 90 with a thickness of 1.2 μm; and then baking and curing, for example, baking on a 100° C. hot plate for 2 minutes.

The preparation method further includes: after the through hole 51 is formed and before the source 60 and the drain 70 are formed, performing wet or plasma processing on a hole wall of the through hole 51, to remove impurities on the hole wall of the through hole 51 and roughen the hole wall of the through hole 51. This step facilitates subsequent deposition of metal materials of the source and the drain in the through hole, and improves bonding strength of the metal materials and the hole wall of the through hole. The wet method may use an alkaline solution. For example, immerse the product in the 50° C. ammonium hydroxide saturated solution for about 10 minutes to repair and clean the etching surface, wash the surface with deionized water, and dry the surface on the hot plate.

Figure 11:
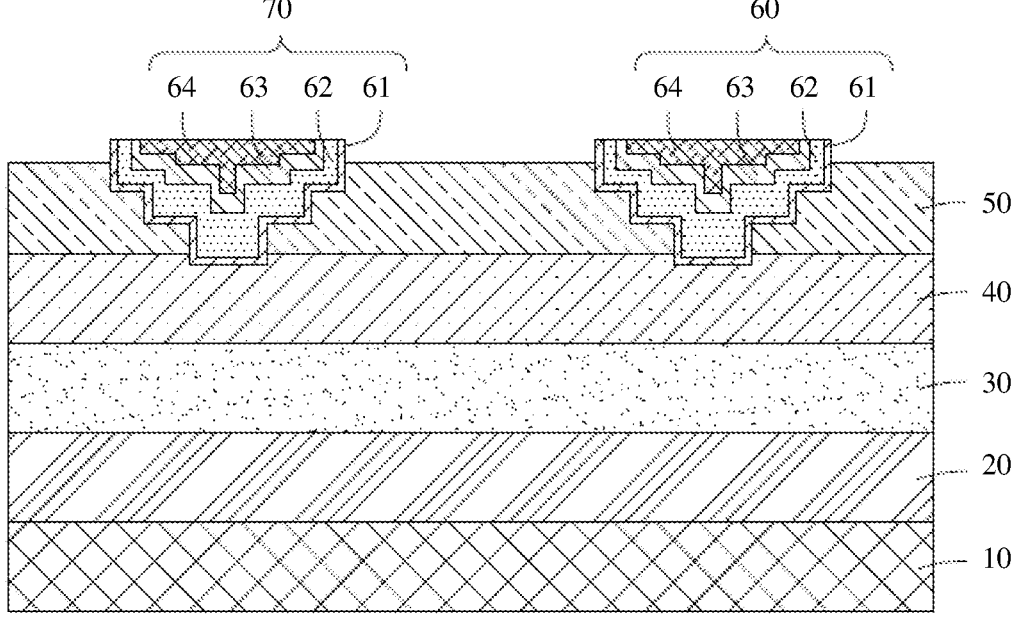
FIG. 11 is an example schematic diagram 8 of an HEMT preparation process according to this disclosure.

The step of forming the source 60 and the drain 70 includes:

as shown in FIG. 11, depositing a Ti layer 61, an Al layer 62, a metal isolation layer 63, and an Au layer 64 sequentially on a hole wall of the through hole 51, and specifically, evaporation plating or sputtering of physical vapor deposition may be used, and a metal evaporation rate may be 0.2 to 0.5 nm/s;

performing annealing treatment on the Ti layer 61, the Al layer 62, the metal isolation layer 63, and the Au layer 64 that are formed through deposition, to form a good ohmic contact. A material of the metal isolation layer 63 is selected from at least one of Ni, Pt, Cr, Pd, and Mo metals.

In this embodiment, a thickness of the Ti layer 61 is greater than or equal to 10 nm and less than or equal to 30 nm. A thickness of the Al layer 62 is greater than or equal to 100 nm and less than or equal to 200 nm. A thickness of the metal isolation layer 63 is greater than or equal to 30 nm and less than or equal to 60 nm. A thickness of the Au layer 64 is greater than or equal to 50 nm and less than or equal to 100 nm. An annealing temperature is greater than or equal to 500° C. and less than or equal to 800° C.

A specific process of the thermal annealing treatment may be: filling N$_2$ into an annealing furnace to exhaust air in the annealing furnace, setting the annealing temperature to be greater than or equal to 500° C. and less than or equal to 800° C., setting temperature rise time to 20 s, heat preservation time to 2 minutes, and temperature drop time to 30 s.

The preparation method further includes:

before the step of forming the source 60 and the drain 70, form a shield layer (not shown in the figure) on a surface of a product opened with the through hole 51, where the light shield layer does not cover a hole wall of the through hole 51.

After the step of forming the source 60 and the drain 70, the shield layer on the surface of the product is stripped off.

The shield layer may be the photoresist layer 90 in the foregoing step, and is configured to shield a region in which the product does not need to deposit the source 60 and the drain 70, and only the through hole 51 is exposed relatively. In this way, when metal materials of the source 60 and the drain 70 are deposited in a subsequent step, the metal materials are deposited into the through hole 51 and a surface of the shield layer. After the deposition is completed, the shield layer is stripped off, so that the shield layer and the metal materials attached to the shield layer are removed, and the metal materials in the through hole 51 are retained.

It may be understood that, because the shield layer and the metal materials on the upper surface 52 are finally stripped off, both the source 60 and the drain 70 protrude relative to the upper surface 52 of the AlGaN barrier layer 50.

When the photoresist layer 90 in the foregoing step is used as the shield layer, a specific process for removing the shield layer from the surface of the product may be: using NMP water bath to heat the shield layer at 50° C. for 30 minutes; then using acetone to perform ultrasonic cleaning for 5 minutes, using alcohol to perform ultrasonic cleaning for 3 minutes, and using deionized water to rinse the shield layer for 1 minute, to ensure that the metal on the shield layer is stripped off, and finally drying the shield layer on a 100° C. hot plate.

According to the HEMT preparation method in this application, the etching process of the step-shaped through hole 51 is highly consistent and stable, and is suitable for mass production.

Figure 12:
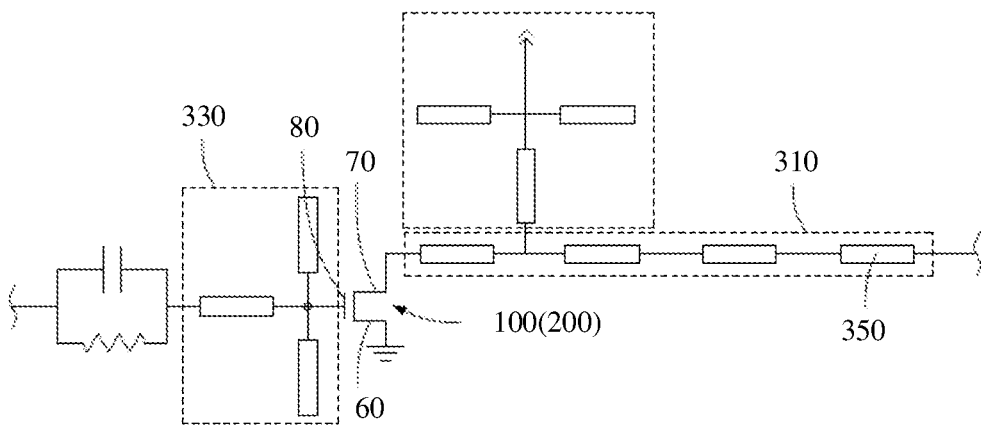
FIG. 12 is an example partial circuit diagram of a power amplifier to which an HEMT according to this disclosure is applied.

This application further provides a power amplifier to which the foregoing HEMT is applied. FIG. 12 shows a part of an example power amplifier, where the power amplifier includes the HEMT 100 and the HEMT 200, and other electronic components, and the other electronic components include a resistor, an inductor, a capacitor, and the like. In this embodiment, the gate 80 of the HEMTs 100, 200 is electrically connected to an input matching network 330, the source 60 is grounded, and the drain 70 is electrically connected to a compensator 310. In this embodiment, the compensator 310 includes a plurality of resistors 350 connected in series, and the input matching network 330 includes a plurality of resistors 350 electrically connected. It may be understood that the power amplifier is not limited to that shown in FIG. 12, and may be adjusted and designed based on a circuit design requirement. Correspondingly, the electronic components connected to the drain 70 and the gate 80 of the HEMT may also be adjusted and designed based on the circuit design requirement.

Figure 13:
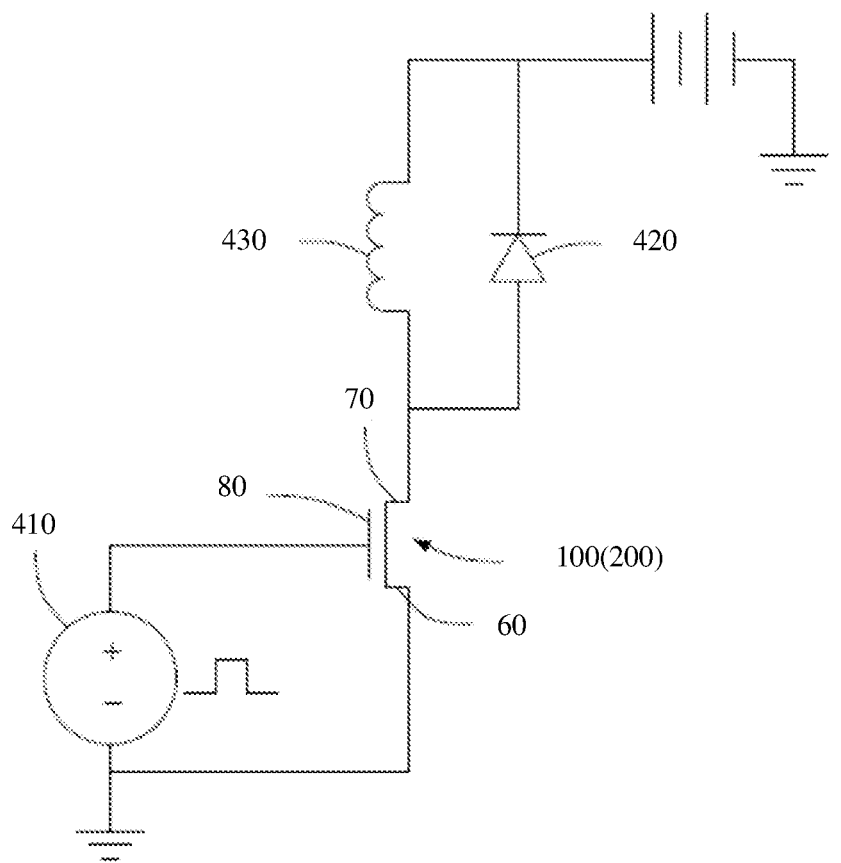
FIG. 13 is an example circuit diagram of a power switch to which an HEMT according to this disclosure is applied.

This application further provides a power switch to which the foregoing HEMT is applied. An example power switch shown in FIG. 13 includes the HEMT 100 and the HEMT 200, and other electronic components, where the other electronic components may include a power supply, an inductor, a diode, and the like. The source 60 of the HEMTs 100, 200 is grounded, the drain 70 of the HEMTs is connected to a power supply 410, and the gate 80 of the HEMTs is connected to an anode of a diode 420 and an inductor 430. It may be understood that the power switch is not limited to that shown in FIG. 13, and may be adjusted and designed based on a circuit design requirement. Correspondingly, electronic components connected to the drain 70 and the gate 80 of the HEMT 100 and the HEMT 200 may also be adjusted and designed based on the circuit design requirement.

It should be noted that the foregoing descriptions are merely specific implementations of this application, but are not intended to limit the protection range of this disclosure. Any variation or replacement readily figured out by a person skilled in the art within the technical scope disclosed in this disclosure shall fall within the protection range of this disclosure. The implementations of this disclosure and the features in the implementations may be mutually combined. Therefore, the protection range of this disclosure shall be subject to the protection range of the claims.

15

16

What is claimed is:

1. A high electron mobility transistor, comprising:

a substrate;

a source;

a drain;

a GaN channel layer; and an AlGaN barrier layer;

a nucleation layer, and a buffer layer, wherein the GaN channel layer and the AlGaN barrier layer are sequentially stacked on the substrate, the AlGaN barrier layer includes two through holes that are spaced apart from each other, each of the two through holes penetrates the AlGaN barrier layer along a thickness direction of the AlGaN barrier layer, each of the two through holes includes a hole wall having at least one stepped structure, each of the two through holes has an upper opening away from the substrate and a lower opening close to the substrate, the upper opening includes an opening area greater than an opening area of the lower opening, the source and the drain each fill up a through hole from the two through holes, and the source and the drain are directly in contact with and connected to the GaN channel layer, the nucleation layer and the buffer layer are sequentially stacked on the substrate, the nucleation layer is located between the substrate and the buffer layer, the buffer layer is located between the nucleation layer and the GaN channel layer, the buffer layer includes a material made of graded AlGaN or GaN/AlN superlattices, a content of Al in the graded AlGaN gradually increases along a direction close to the substrate, and the buffer layer has a thickness greater than or equal to 0.1 μm and less than or equal to 10 μm.

2. The high electron mobility transistor according to claim 1, wherein each of the two through holes includes at least two through hole parts sequentially in communication along the thickness direction of the AlGaN barrier layer, and the at least two through hole parts include opening areas decreasing one by one along the thickness direction of the AlGaN barrier layer and in a direction pointing to the substrate.

3. The high electron mobility transistor according to claim 1, wherein the source and the drain protrude relative to a surface of the AlGaN barrier layer away from the substrate, and the source and the drain extend into the GaN channel layer.

4. The high electron mobility transistor according to claim 1, wherein the source and the drain each comprise a Ti layer, an Al layer, a metal isolation layer, and an Au layer, the Ti layer, the Al layer, the metal isolation layer, and the Au layer are sequentially attached to the hole wall of the through hole, the metal isolation layer includes a material selected from at least one of Ni, Pt, Cr, Pd, or Mo metals, the Ti layer has a thickness greater than or equal to 10 nm and less than or equal to 30 nm, the Al layer has a thickness greater than or equal to 100 nm and less than or equal to 200 nm, the metal isolation layer has a thickness greater than or equal to 30 nm and less than or equal to 60 nm, and the Au layer has a thickness greater than or equal to 50 nm and less than or equal to 100 nm.

5. The high electron mobility transistor according to claim 1, wherein the nucleation layer includes a material made of AlN, and the nucleation layer has a thickness greater than or equal to 0.1 nm and less than or equal to 500 nm.

6. The high electron mobility transistor according to claim 1, wherein the GaN channel layer has a thickness greater than or equal to 0.1 μm and less than or equal to 10 μm, and the AlGaN barrier layer has a thickness greater than or equal to 0.1 nm and less than or equal to 50 nm.

7. The high electron mobility transistor according to claim 1, wherein the source and the drain each comprise ohmic contact metal in contact with the AlGaN barrier layer and the GaN channel layer, and the ohmic contact metal is in stepped contact with the AlGaN barrier layer.

8. A method for preparing a high electron mobility transistor, the method comprising:

forming a GaN channel layer and an AlGaN barrier layer sequentially on a substrate;

opening, in the AlGaN barrier layer, two through holes that penetrate through the AlGaN barrier layer, wherein the two through holes are spaced apart from each other, each of the two through holes includes a hole wall having at least one stepped structure, the two through holes each has an upper opening away from the substrate and a lower opening close to the substrate, and the upper opening includes an opening area greater than an opening area of the lower opening; and respectively forming a source and a drain by filling the two through holes with a metal material, wherein the source and the drain are directly in contact with and connected to the GaN channel layer, and in association with the hole wall of a through hole having one stepped structure, forming the two through holes comprises;

forming a patterned photoresist layer on the AlGaN barrier layer thereby enabling the photoresist layer to partially cover an upper surface of the AlGaN barrier layer away from the substrate, wherein a region of the upper surface not covered by the photoresist layer includes a source/drain windowing region;

etching the AlGaN barrier layer from the source/drain windowing region by using a dry etching method, wherein an etching depth is less than a thickness of the AlGaN barrier layer;

partially removing a portion of the photoresist layer surrounding the source/drain windowing region thereby enlarging the source/drain windowing region; and etching through the AlGaN barrier layer by etching the AlGaN barrier layer further from the enlarged source/drain windowing region by using the dry etching method.

9. The method according to claim 8, wherein in association with the hole wall of a through hole having at least two stepped structures, forming the two through holes comprises:

forming a patterned photoresist layer on the AlGaN barrier layer thereby enabling the photoresist layer to partially cover an upper surface of the AlGaN barrier layer away from the substrate, wherein a region of the upper surface not covered by the photoresist layer includes a source/drain windowing region;

etching the AlGaN barrier layer from the source/drain windowing region by using a dry etching method, wherein an etching depth is less than a thickness of the AlGaN barrier layer;

enlarging the source/drain windowing region by partially removing a portion of the photoresist layer surrounding the source/drain windowing region;

etching the AlGaN barrier layer further from the enlarged source/drain windowing region by using the dry etching method, without etching through the AlGaN barrier layer; and repeating the process of partially removing the portion of the photoresist layer surrounding the source/drain windowing region and the process of dry etching the AlGaN barrier layer at least once, until the AlGaN barrier layer is etched through.

10. The method according to claim 8, wherein a mixed gas of $Cl_2$ and $BCl_3$ is used as an etching gas for the dry etching, and $O_2$ is used as an etching gas for partially removing the photoresist layer.

11. The method according to claim 8, further comprising:
performing wet or plasma treatment on the hole wall of a through hole after the two through holes are formed and before the source and the drain are formed thereby removing impurities on the hole wall of the through hole and roughening the hole wall of the through hole.

12. The method according to claim 8, wherein forming the source and the drain comprises:
depositing a Ti layer, an Al layer, a metal isolation layer, and an Au layer sequentially on the hole wall of a through hole, wherein the metal isolation layer includes a material selected from at least one of Ni, Pt, Cr, Pd, and Mo metals; and
performing annealing treatment on the Ti layer, the Al layer, the metal isolation layer, and the Au layer, wherein the Ti layer, the Al layer, the metal isolation layer, and the Au layer are formed through deposition.

13. The method according to claim 12, wherein the Ti layer has a thickness greater than or equal to 10 nm and less than or equal to 30 nm, the Al layer has a thickness greater than or equal to 100 nm and less than or equal to 200 nm, the metal isolation layer has a thickness greater than or equal to 30 nm and less than or equal to 60 nm, and the Au layer has a thickness greater than or equal to 50 nm and less than or equal to 100 nm.

14. The method according to claim 12, wherein an annealing temperature of the annealing treatment is greater than or equal to 500° C. and less than or equal to 800° C.

15. The method according to claim 8, further comprising:
forming, sequentially on the substrate, before the GaN channel layer and the AlGaN barrier layer are formed, a nucleation layer and a buffer layer, wherein the nucleation layer and the buffer layer are stacked, the nucleation layer is located between the substrate and the buffer layer, and the buffer layer is located between the nucleation layer and the GaN channel layer.

16. The method according to claim 8, wherein
the source and the drain each comprise ohmic contact metal in contact with the AlGaN barrier layer and the GaN channel layer, and
the ohmic contact metal is in stepped contact with the AlGaN barrier layer.

17. A power amplifier, comprising:
a high electron mobility transistor;
a first electronic component; and
a second electronic component, wherein
the high electron mobility transistor comprises:
a substrate;
a source;
a drain;
a GaN channel layer; and
an AlGaN barrier layer;
a nucleation layer; and
a buffer layer, wherein
the GaN channel layer and the AlGaN barrier layer are sequentially stacked on the substrate,
the AlGaN barrier layer includes two through holes that are spaced apart from each other,
each of the two through holes penetrates the AlGaN barrier layer along a thickness direction of the AlGaN barrier layer,
each of the two through holes includes a hole wall having at least one stepped structure,
each of the two through holes has an upper opening away from the substrate and a lower opening close to the substrate,
the upper opening includes an opening area greater than an opening area of the lower opening,
the source and the drain each fill up a through hole from the two through holes, and the source and the drain are directly in contact with and connected to the GaN channel layer,
the nucleation layer and the buffer layer are sequentially stacked on the substrate,
the nucleation layer is located between the substrate and the buffer layer,
the buffer layer is located between the nucleation layer and the GaN channel layer,
the buffer layer includes a material made of graded AlGaN or GaN/AlN superlattices,
a content of Al in the graded AlGaN gradually increases along a direction close to the substrate, and
the buffer layer has a thickness greater than or equal to 0.1 μm and less than or equal to 10 μm.

18. The power amplifier of claim 17, wherein
the high electron mobility transistor further comprises a gate,
the source of the high electron mobility transistor is grounded,
the drain of the high electron mobility transistor is connected to the first electronic component, and
the gate of the high electron mobility transistor is connected to the second electronic component.

19. The power amplifier of claim 17, wherein
the source and the drain each comprise ohmic contact metal in contact with the AlGaN barrier layer and the GaN channel layer, and
the ohmic contact metal is in stepped contact with the AlGaN barrier layer.

* * * * *